United States Patent [19]
Petschauer et al.

[11] Patent Number: 5,361,232
[45] Date of Patent: Nov. 1, 1994

[54] CMOS STATIC RAM TESTABILITY

[75] Inventors: Richard J. Petschauer, Edina; Paul G. Johnson, Brooklyn Park, both of Minn.

[73] Assignee: Unisys Corporation, Blue Bell, Pa.

[21] Appl. No.: 978,128

[22] Filed: Nov. 18, 1992

[51] Int. Cl.⁵ ............................................. G01R 31/28
[52] U.S. Cl. .................................. 365/201; 371/21.1; 365/203
[58] Field of Search ............... 365/201, 189.06, 200, 365/189.01, 203; 371/10.1, 10.2, 10.3, 21.1, 21.2, 21.3

[56] References Cited

U.S. PATENT DOCUMENTS

| | | | |
|---|---|---|---|
| 4,379,344 | 4/1983 | Ozawa et al. | 365/203 |
| 4,399,519 | 8/1983 | Masuda et al. | 365/203 |
| 4,417,328 | 11/1983 | Ochii | 365/203 |
| 5,034,923 | 7/1991 | Kuo et al. | 365/189.01 |
| 5,136,545 | 8/1992 | Takayanagi | 365/203 |
| 5,166,608 | 11/1992 | Bowles | 365/201 |
| 5,255,230 | 10/1994 | Chan et al. | 365/201 |

Primary Examiner—Eugene R. LaRoche
Assistant Examiner—Vu Le
Attorney, Agent, or Firm—Nawrocki, Rooney & Sivertson

[57] ABSTRACT

An apparatus and method for improving the testability of six cell CMOS SRAM circuits. The technique involves adding transistors and the ability to effectively disable the precharge circuitry during the test mode. This makes the pull up transistors the only current source for switching the memory cell. An open or weak pull up transistor, which would appear as an intermittent soft failure under operational conditions because of the current sourcing of the precharge circuitry, becomes a hard stuck-at failure under the test conditions. Because the precharge circuitry is disabled for all memory cells, a slower memory clock speed is used for memory cycling during the test mode.

21 Claims, 3 Drawing Sheets

CMOS STATIC RAM TESTABILITY

BACKGROUND OF THE INVENTION

1. Field of the Invention

The present invention generally relates to digital data memory circuits and more particularly relates to improvements to CMOS static random access memory.

2. Description of the Prior Art

Various early main memory storage devices tended to utilize mechanical motion for access. Because these devices were so slow, they were soon replaced by electromagnetic systems, such as magnetic core memory. These technologies dominated in main frame computer design until the early 70's when various semiconductor techniques became dense enough and cheap enough to enter large scale usage.

Although bipolar devices tend to have an inherent speed advantage over metal oxide semiconductors (MOS), the lower power requirements of the latter proved particularly attractive. Complementary symmetry metal oxide semiconductors (CMOS) tend to have the lowest quiescent power requirements within the class. For that reason, CMOS is a particularly attractive technology for large scale static random access memories.

Many CMOS static random access memories (SRAM's) utilize four transistors per storage cell. However, due to the advantages of employing pull up transistors for each side of the cell, the six transistor cell approach is gaining in popularity. These advantages are higher operational stability, higher alpha-particle immunity, and a simpler process, which is more similar to the process for random logic circuit fabrication.

A primary disadvantage of the six transistor cell CMOS SRAM is that certain open circuit failures in the pull up circuitry can appear as intermittent or soft failures. Whereas the analogous problem of open pull up resistors can also occur with four transistor cells, the greater popularity and complexity of the six transistor cells makes the problem more acute. Because such faults do not result in a hard failure, testing and failure analysis have proven particularly difficult. Often times extreme temperature cycling and sophisticated timing functions have been utilized during the manufacturing process, and sometimes all of the defects are still not located. In addition, such techniques are particularly difficult if not impossible to employ in the field with operational main frames.

An approach to testing is suggested in "Soft-Defect Detection (SDD) Technique for a High-Reliability CMOS SRAM", by Clinton Kuo, et al. in IEEE Journal of Solid-State Circuits, Volume 25, No. 1, February 1990. The Kuo et al. approach attempts to perform complete circuit by circuit analysis of each current path within the cell. The technique requires the addition of substantial specialized control and addressing circuitry. However, the greatest disadvantage of the method is the relatively long time frame needed to run the six separate tests for each cell.

SUMMARY OF THE INVENTION

The present invention overcomes the disadvantages found in the prior art by providing a technique to rapidly test six cell CMOS SRAM devices for soft failures using a minimal amount of additional circuitry. Basically, this approach involves the addition of two transistors to each column of cells to disable the precharge circuitry during a special test mode. These transistors sink a current to upset a cell which has a weak or missing pull up transistor or related circuitry. In this test mode, any cell having an open or missing pull up transistor circuit path will appear as a "stuck-at" hard failure.

During the test mode, the precharge current is not available to improve switching performance of any memory cells, including those which are fully operational. Therefore, cycling of the memory during this test mode must be performed at less than normal speed. However, because this test mode makes soft failures appear to be hard failures, simple memory testing for hard failures is adequate to locate both types of failures. Separate complex testing for soft defects is not needed. Therefore in a given situation, either the total time for testing may be reduced or the quality of testing may be increased for the same amount of testing time.

The primary hardware required to implement the preferred mode of the present invention is two switches and an enable input, which are added to each column of cells. However, because all cells can be placed in the test mode simultaneously, only one additional input pin is needed for the entire CMOS SRAM device. With the exception of a circuit to set this single input pin to the test mode, the complete test is run with the existing addressing hardware and software, although the memory clock must be slowed to run the test.

The primary change from prior art systems to those employing the present invention involve the CMOS SRAM devices themselves. The slight modifications to the remaining hardware (i.e. test mode enable signal and slightly reduced test mode clock speed) can be implemented in systems which employ the prior art CMOS SRAM devices as well. Because the test software and the testing documentation do not change, the present invention becomes completely downward compatible and makes the use of CMOS SRAM devices employing the present invention transparent to the user, except for the radical reduction in intermittent soft failure rates.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
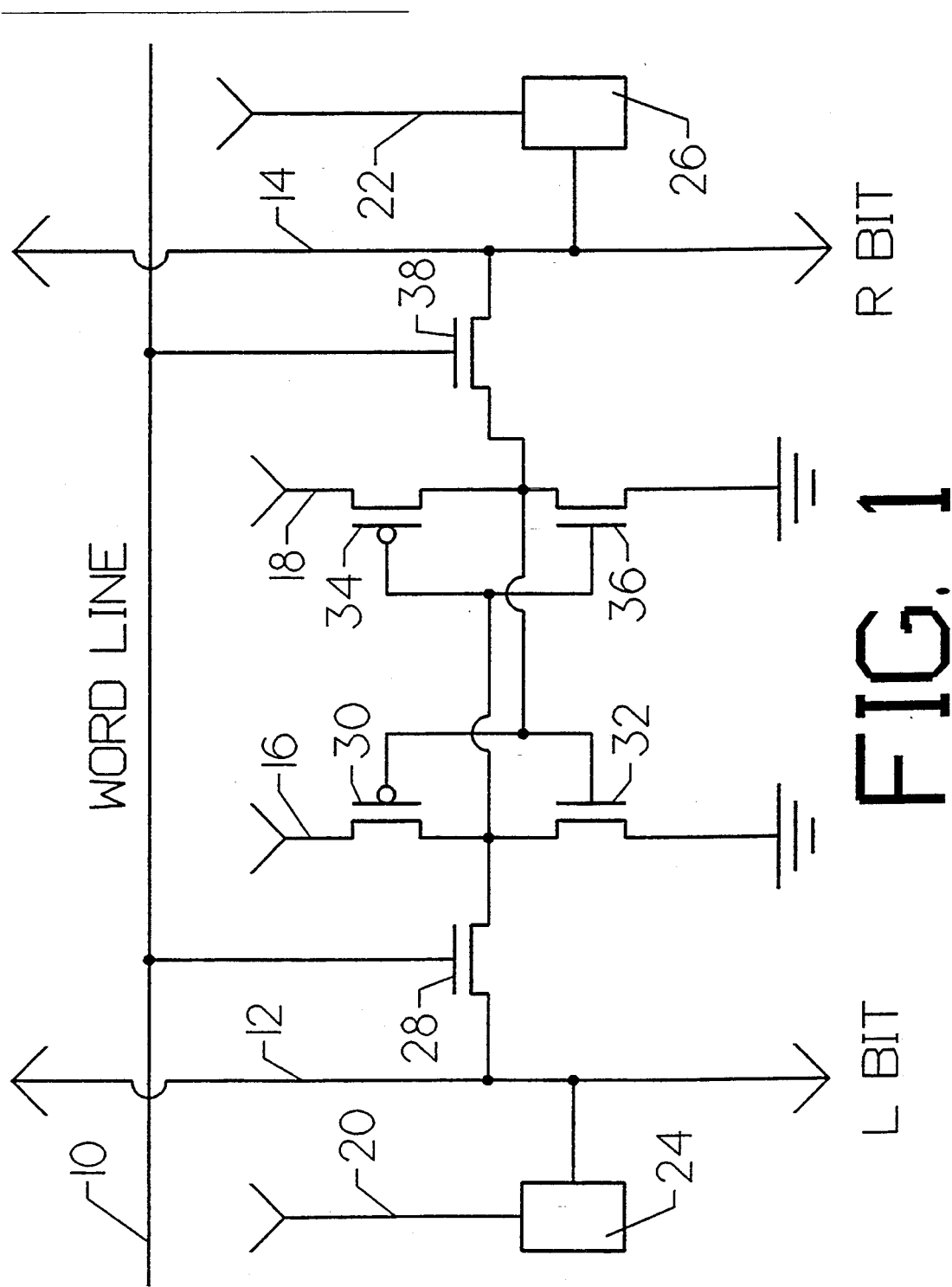
FIG. 1 is a schematic circuit diagram of a typical six transistor CMOS SRAM cell.

FIG. 1 is a schematic circuit diagram of a typical six transistor CMOS SRAM cell as employed with the present invention. The circuit of FIG. 1 is capable of storing one binary bit of information. In most commercial devices, many thousands of individual cells are fabricated on a single substrate. A finished device having, for example, storage capacity for 256K bytes would contain two million such cells. Other modularities are also employed and individual device capacity is not to be deemed limiting of the present invention. The individual cells are arranged on the substrate to permit ease of addressing for read and write operations.

Focusing on the single cell of FIG. 1, it can be seen that the cell actually contains a bi-stable circuit comprising CMOS transistors 30, 32, 34, and 36. By coupling the drain of transistor 32 to the gate of transistor 36 and the drain of transistor 36 to the gate of transistor 32, this transistor pair becomes the primary bi-state device capable of storing the single bit of information. However, complementary transistors 30 and 34 are similarly coupled ensuring that any change of state of the primary transistor pair results in an equal and opposite state change by the secondary transistor pair. This complementary state change greatly improves switching stability, because it guarantees that a switch from one to zero occurs at the same speed as a switch from zero to one.

Transistors 30 and 32 are coupled from current source line 16 to ground, and transistors 34 and 36 are coupled from current source line 18 to ground. However, because the gates of transistors 30 and 32 are coupled but complementary, either one or the other of the transistors will be switched on in normal operation but not both. Transistors 34 and 36 are similarly coupled to be in opposite states.

The state of the primary transistor pair 32 and 36 (and transistor pair 30 and 34) may be read or changed whenever word line 10 enables switches 28 and 38. Closing switch 28 couples left bit line 12 to the drains of transistors 30 and 32 and the gates of transistors 34 and 36. Similarly, closing switch 38 couples the gates of transistors 30 and 32 and the drains of transistors 34 and 36 to right bit line 14. An enable placed on word line 10 corresponds to addressing the cell. Word line 10 is coupled to all other cells at the various bit positions, which are to be accessed together in parallel to produce an addressed word (see also FIG. 3).

During a write operation, the cell is addressed (i.e. an enable is place on word line 10) and left bit line 12 and right bit line 14 are placed in complementary states. Because switches 28 and 38 are closed, primary transistor pair 32 and 36 (and also secondary transistor pair 30 and 34) are driven to the complementary states defined by left bit line 12 and right bit line 14. This may involve switching of the bi-stable or not depending upon whether its previous state was the same or different from that on left bit line 12 and right bit line 14. Left bit line 12 and right bit line 14 couple to the other cells within the same column (i.e. are at the same bit position in other words). However, the only cell within the column to respond is the one having word line 10 energized (see also FIG. 3).

The primary transistor pair (i.e. transistors 32 and 36), along with the secondary transistor pair (i.e. transistors 30 and 34) are similarly addressed during read operations. However, during a read, left bit line 12 and right bit line 14 are neutral and permitted to source or sink current depending upon the state of transistors 32 and 36 (and transistors 30 and 34).

To improve read and write access speed, precharge circuits 24 and 26 with current sources 20 and 22, respectively, source additional current to left bit line 12 and right bit line 14 to overcome some of the time penalty introduced by distributed capacitance in the circuitry. The result is a memory storage cell having rapid access times for both read and write and considerable stability when switching to either state.

Transistors 30 and 34, often called pull up transistors because of the coupling to current source line 16 and 18, operate in conjunction with precharge circuits 24 and 26 to improve speed and stability. A short of either transistor 30 or 34 will be seen as a "stuck at" hard failure. However, an open circuit or weak operation of either transistor 30 or transistor 34 does not produce such a hard failure. Rather, such a failure reduces overall switching speed, makes switching in one direction much slower than in the other, and generally reduces the stability of the memory cell, which can lose its stored state. At the system level, this can result in intermittent failures. A similar failure can occur with the failure of a pull up resistor in a four transistor cell (not shown).

Figure 2:
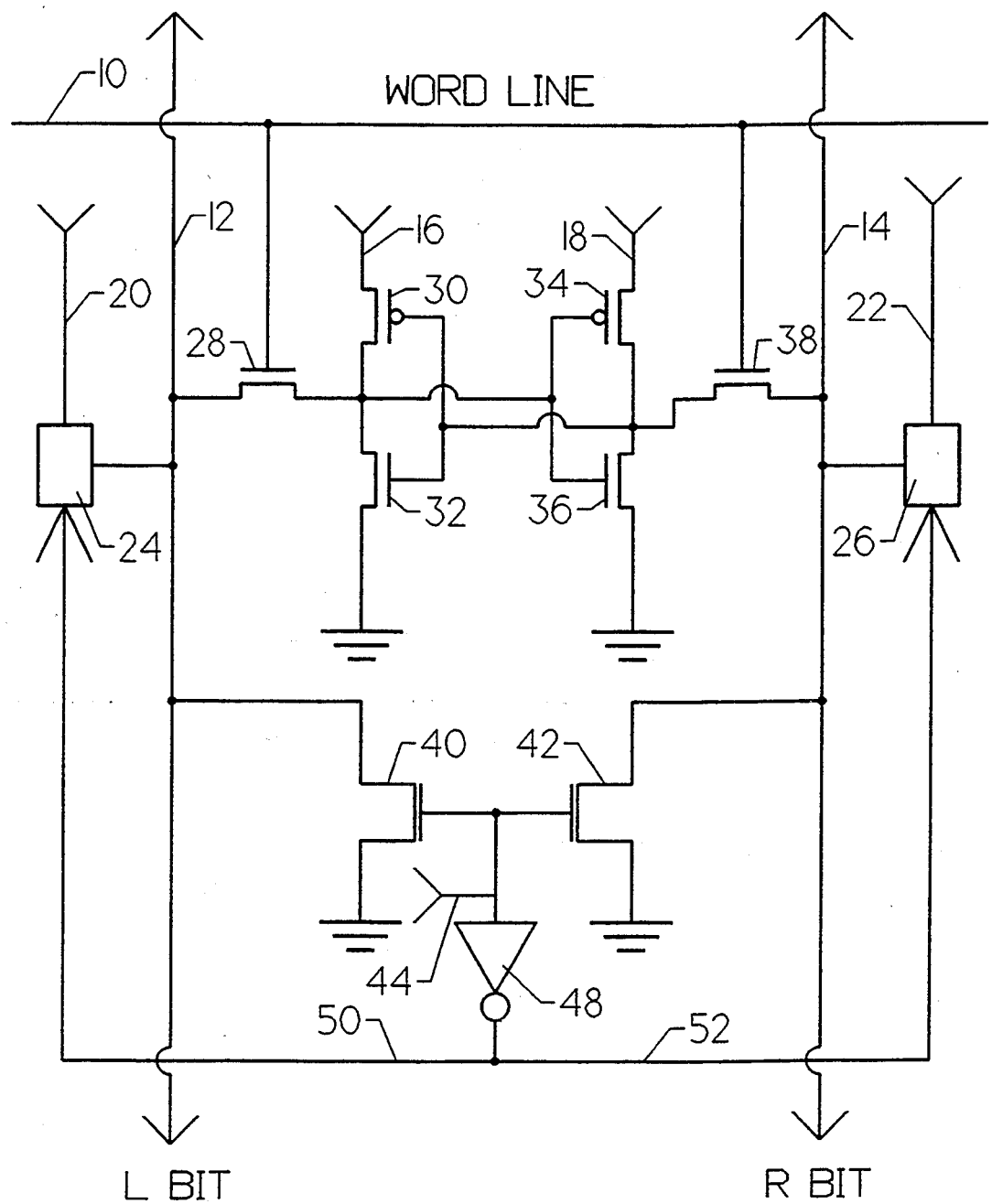
FIG. 2 is a schematic circuit diagram of the six transistor CMOS SRAM cell of FIG. 1 with the addition of the test mode circuitry.

FIG. 2 is a circuit schematic diagram for a memory cell similar to that of FIG. 1 with the addition of circuitry which improves the testability of that memory cell. Transistor 40 has been coupled between left bit line 12 and ground. Similarly transistor 42 has been coupled between right bit line 14 and ground. When an enable signal is placed on line 44, transistors 40 and 42 are turned on sinking current from left bit line 12 and right bit line 14 to ground. This enable is the test mode signal, which after inversion by invertor 48, disables precharge circuits 24 and 26 via lines 50 and 52, respectively. The current sinking of transistors 40 and 42 must be less than that of transistors 30 and 34, so that if transistors 30 and 34 are operating properly, the corresponding bit line remains in the normal state.

Without the current sourcing effect of precharge circuits 24 and 26 (i.e. with the test mode signal present), primary transistors 32 and 36 are sourced by secondary transistors 30 and 34 only. If either transistor 30 or 34 is open or very weak, the corresponding primary transistor is without a good current source. Therefore, the memory cell will be pulled down by transistors 40 or 42 and will reflect a stuck-at hard failure by causing the cell to switch to a failing state.

During the test mode (i.e. with the test mode signal present on line 44), precharge circuits 24 and 26 will have been disabled. Therefore, the overall performance of the memory cell will have been slowed. Testing of the memory cell for this test must be performed at a slower cycle time or errors will occur even without a hardware failure. Such slowing of the memory clock during the test mode is deemed easily implemented. Other memory tests can be run at normal speed with the precharge circuits enabled.

For certain memory cell designs, it may be more effective to couple transistors 40 and 42 to a positive or negative voltage or current source rather than ground. The use of ground as a reference point in the preferred embodiment should not be deemed as a limitation of the present invention.

All individual memory cells in a given memory system may use a single test mode signal which is easily generated. Testing of the memory system would occur at a reduced clock speed. However, no other system level changes need be made to implement the present invention. The same software, test documentation, and maintenance procedures would be used. Therefore, a memory system may employ both prior art and improved memory cells. There is no difference in the normal operational mode. During the test mode, the memory cells according to the present invention would be tested for both hard and soft failures, whereas the prior art memory cells would be tested only for hard failures.

Figure 3:
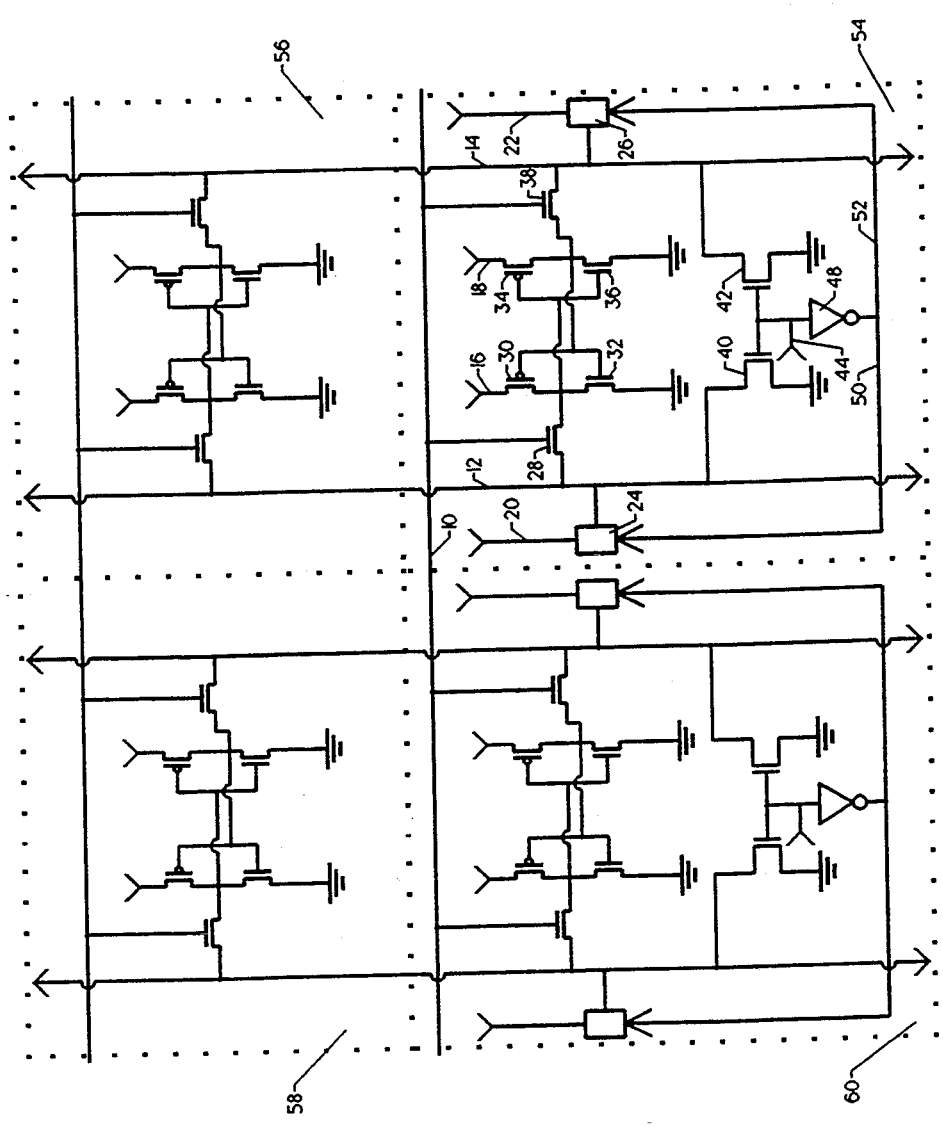
FIG. 3 is a schematic circuit diagram showing interconnection of the individual cells within a multicell memory.

FIG. 3 is an electrical schematic diagram showing coupling of multiple cells to produce a simple multiple cell memory. Cell 54 is as previously described with reference to FIG. 2. It is replicated in the horizontal dimension as shown at cell 60 to add an additional bit position or column to the memory. For a one byte memory, eight such columns are needed. Cells are added in the vertical dimension (i.e. within the column) to increase the address space of the memory. Cell 56 is located at the same bit position as cell 54 but at a different address (i.e. it is not coupled to word line 10). Cell 58 is at the same bit position as cell 60 but is located at the same address as cell 56.

As cells are added in both vertical and horizontal dimensions to produce a memory of practical size, each column has its own precharge circuits 24 and 26. Therefore, each column requires an invertor to disable the precharge circuits during the soft failure test mode, as well as the addition of two transistors to sink current from the left and right bit lines.

Having thus described the preferred embodiments of the present invention, those of skill in the art will be readily able to apply the teachings found herein to yet other embodiments within the scope of the claims hereto attached.

We claim:
1. A digital memory having a test mode comprising:
 a. a bi-stable circuit having the capability to be switched from a first data state to a second data state;
 b. providing means coupled to said bi-stable circuit for providing a pull up current to said bi-stable circuit when switching from said first data state to said second data state;
 c. precharging means coupled to said bi-stable circuit for precharging said bi-stable circuit; and
 d. disabling means coupled to said precharging means for selectively disabling said precharging means when a test mode signal is applied to said disabling means.

2. A digital memory according to claim 1 wherein said bi-stable circuit comprises a transistor pair.

3. A digital memory according to claim 2 wherein said selectively disabling means further comprises a means for sinking current from said providing means.

4. A digital memory according to claim 3 wherein said transistor pair comprises a CMOS transistor pair.

5. A digital memory according to claim 1, 2, 3, or 4 wherein said providing means comprises a transistor pair.

6. A digital memory according to claim 5 wherein said second transistor pair comprises a CMOS transistor pair.

7. A method of testing a CMOS SRAM device having precharge circuitry comprising:
 A. selectively disabling said precharge circuitry in testing mode;
 b. decreasing memory cycle time; and
 c. testing said CMOS SRAM device for soft failures.

8. An apparatus comprising:
 a. a switchable bistable circuit for storing data;
 b. a pull up circuit coupled to said switchable bistable circuit for increasing performance of said switchable bistable circuit;
 c. a test mode circuit coupled to said pull up circuit for dissipating current from said pull up circuit during a test mode.
 d. a precharging circuit coupled to said switchable bistable circuit for precharging said bi-stable circuit; and
 e. a disabling circuit coupled to said precharging circuit and further coupled to said test mode circuit for disabling said precharging circuit during said test mode.

9. An apparatus according to claim 8 wherein said switchable bistable circuit comprises a first transistor pair.

10. An apparatus according to claim 11 wherein said pull up circuit comprises a second transistor pair.

11. An apparatus according to claim 10 wherein said first transistor pair is a CMOS transistor pair.

12. An apparatus according to claim 10 wherein said second transistor pair is a CMOS transistor pair.

13. An apparatus according to claim 12 wherein said first transistor pair is a CMOS transistor pair.

14. An apparatus according to claim 13 further comprising:
 a. a first bit line coupled to a first transistor of said first CMOS transistor pair; and,
 b. a second bit line coupled to a second transistor of said first CMOS transistor pair.

15. An apparatus according to claim 14 wherein said first transistor is coupled to said first bit line via a first switch and said second transistor is coupled to said second bit line via a second switch.

16. An apparatus according to claim 15 further comprising a word line coupled to said first switch and said second switch whereby the state of said word line determines when said first switch and said second switch are open and closed.

17. An apparatus according to claim 16 wherein said first switch comprises a first CMOS transistor and said second switch comprises a second CMOS transistor.

18. A digital memory having a test mode comprising:
 a. a first P-type CMOS device having a source electrode coupled to a first power supply, a drain electrode, and a gate electrode;
 b. a second P-type CMOS device having a source electrode coupled to the first power supply, a drain electrode coupled to the gate electrode of the first P-type CMOS device, and a gate electrode coupled to the drain electrode of the first P-type CMOS device;
 c. a first N-type CMOS device having a source electrode coupled to a second power supply, a drain electrode coupled to the drain electrode of the first P-type CMOS device, and a gate electrode coupled to the drain electrode of the second P-type CMOS device;
 d. a second N-type CMOS device having a source electrode coupled to the second power supply, a drain electrode coupled to the drain electrode of the second P-type CMOS device, and a gate electrode coupled to the drain electrode of the first P-type CMOS device;
 e. a first bit line;
 f. a second bit line;
 g. a word line;
 h. a third N-type CMOS device having a source electrode coupled to the first bit line, a drain electrode coupled to the drain electrode of the first P-type CMOS device, and a gate electrode coupled to the word line;
i. a fourth N-type CMOS device having a source electrode coupled to the second bit line, a drain electrode coupled to the drain electrode of the second P-type CMOS device, and a gate electrode coupled to the word line;
j. a test mode line which may be activated when the digital memory is in the test mode;
k. a fifth N-type CMOS device having less drive than the first P-type CMOS device and having a source electrode coupled to the second power supply, a drain electrode coupled to the first bit line, and a gate electrode coupled to the test mode line;
l. a sixth N-type CMOS device having less drive than the second P-type CMOS device and having a source electrode coupled to the second power supply, a drain electrode coupled to the second bit line, and a gate electrode coupled to the test mode line;
n. a first precharge circuit for precharging the first bit line coupled to the test mode line, the first bit line, and a third power supply, wherein the test mode line disables the first precharge circuit when active; and
o. a second precharge circuit for precharging the second bit line coupled to the test mode line, the second bit line, and the third power supply, wherein the test mode line disables the second precharge circuit when active.

19. A digital memory having a test mode comprising:
a. a first P-type CMOS device having a source electrode coupled to a first power supply, a drain electrode, and a gate electrode;
b. a second P-type CMOS device having a source electrode coupled to the first power supply, a drain electrode coupled to the gate electrode of the first P-type CMOS device, and a gate electrode coupled to the drain electrode of the first P-type CMOS device;
c. a first N-type CMOS device having a source electrode coupled to a second power supply, a drain electrode coupled to the drain electrode of the first P-type CMOS device, and a gate electrode coupled to the drain electrode of the second P-type CMOS device;
d. a second N-type CMOS device having a source electrode coupled to the second power supply, a drain electrode coupled to the drain electrode of the second P-type CMOS device, and a gate electrode coupled to the drain electrode of the first P-type CMOS device;
e. a first bit line;
f. a second bit line;
g. a word line;
h. a third N-type CMOS device having a source electrode coupled to the first bit line, a drain electrode coupled to the drain electrode of the first P-type CMOS device, and a gate electrode coupled to the word line;
i. a fourth N-type CMOS device having a source electrode coupled to the second bit line, a drain electrode coupled to the drain electrode of the second P-type CMOS device, and a gate electrode coupled to the word line;
j. a test mode line which may be activated when the digital memory is in the test mode;
k. a fifth N-type CMOS device having less drive than the first P-type CMOS device and having a source electrode coupled to the second power supply, a drain electrode coupled to the first bit line, and a gate electrode coupled to the test mode line;
l. a sixth N-type CMOS device having less drive than the second P-type CMOS device and having a source electrode coupled to the second power supply, a drain electrode coupled to the second bit line, and a gate electrode coupled to the test mode line;
m. a CMOS inverter having an input port coupled to the test mode line, and an output port;
n. a first precharge circuit for precharging the first bit line coupled to the output port of the inverter, the first bit line, and a third power supply, wherein the output of the inverter disables the first precharge circuit when the test mode line is active; and
o. a second precharge circuit for precharging the second bit line coupled to the output port of the inverter, the second bit line, and the third power supply, wherein the output of the inverter disables the second precharge circuit when the test mode line is active.

20. An apparatus according to claim 19 wherein the first precharge circuit comprises:
p. a third P-type CMOS device for precharging the first bit line having a source electrode coupled to the third power supply, a drain electrode coupled to the first bit line, and a gate electrode coupled to the output port of the CMOS inverter.

21. An apparatus according to claim 20 wherein the second precharge circuit comprises:
q. a fourth P-type CMOS device for precharging the second bit line having a source electrode coupled to the third power supply, a drain electrode coupled to the second bit line, and a gate electrode coupled to the output port of the CMOS inverter.

* * * * *